(12) United States Patent
Nakanishi et al.

(10) Patent No.: US 8,549,730 B2
(45) Date of Patent: Oct. 8, 2013

(54) SUPERCONDUCTOR DEVICE (75) Inventors: Teru Nakanishi, Kawasaki (JP);
Akihiko Akasegawa, Kawasaki (JP);
Kazunori Yamanaka, Kawasaki (JP);
Kazuaki Kurihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 666 days.

(21) Appl. No.: 11/898,238

(22) Filed: Sep. 11, 2007

(65) Prior Publication Data
US 2008/0061908 A1  Mar. 13, 2008

(30) Foreign Application Priority Data

Sep. 13, 2006 (JP) ................................. 2006-248201

(51) Int. Cl.
*H01R 4/68* (2006.01)
*H01R 9/05* (2006.01)
*H01R 13/03* (2006.01)
*H01R 24/52* (2011.01)
*H01P 1/203* (2006.01)

(52) U.S. Cl.
USPC ............... 29/599; 29/843; 333/99 S; 439/578

(58) Field of Classification Search
USPC ........................ 29/599, 843; 333/99 S, 206; 439/578–585, 886
See application file for complete search history.

(56) References Cited

U.S. PATENT DOCUMENTS

| | | | | |
|---|---|---|---|---|
| 2,312,794 A * | 3/1943 | Brownstein | ................... | 439/600 |
| 3,175,181 A * | 3/1965 | Grabbe | ................... | 439/886 |
| 3,622,944 A * | 11/1971 | Tsuchiya et al. | ............... | 439/179 |
| 4,273,407 A * | 6/1981 | Snuffer et al. | ................ | 439/579 |
| 4,966,142 A * | 10/1990 | Zimmerman et al. | ..... | 228/262.9 |
| 5,651,698 A * | 7/1997 | Locati et al. | ................... | 439/578 |
| 6,680,128 B2 * | 1/2004 | Mei | ............................... | 428/570 |
| 7,394,024 B2 | 7/2008 | Kohayashi et al. | | |
| 2003/0150743 A1 * | 8/2003 | Obata et al. | ................... | 205/252 |
| 2005/0020452 A1 * | 1/2005 | Nakanishi et al. | ............ | 505/100 |

FOREIGN PATENT DOCUMENTS

| | | | |
|---|---|---|---|
| EP | 28763 A2 | * | 5/1981 |
| JP | 2000150008 A | * | 5/2000 |
| JP | 2001-21782 A | | 1/2001 |
| JP | 2003-282197 | | 10/2003 |
| JP | 2004-304164 | | 10/2004 |

OTHER PUBLICATIONS

Lee, C.C.; Wang, C.Y.; Matijasevic, G.; , "Au-In bonding below the eutectic temperature," Components, Hybrids, and Manufacturing Technology, IEEE Transactions on , vol. 16, No. 3, pp. 311-316, May 1993 doi: 10.1109/33.232058 URL: http://ieeexplore.ieee.org/stamp/stamp.jsp?tp=&arnumber=232058&isnumber=6000.*
Machine Translation of JP 2000150008 A, obtained Aug. 23, 2012.*
"Japanese Office Action" mailed by JPO and corresponding to Japanese application No. 2006-248201 on Feb. 15, 2011, with English translation.
Japanese Office Action mailed Jul. 5, 2011 for corresponding Japanese Application No. 2006-248201, with Partial English-language Translation.

* cited by examiner

*Primary Examiner* — Livius R Cazan
(74) *Attorney, Agent, or Firm* — Fujitsu Patent Center (57) ABSTRACT The coaxial connector 10 to be connected with a coaxial cable has a surface covering layer 20 formed of a metal material which causes an eutectic reaction with In on the surface of a terminal 12 which is a core conductor. Because of the surface covering layer 20 of a metal material which causes the eutectic reaction with In formed on the surface of the terminal of the coaxial connector, the terminal of the coaxial connector and the electrode of a superconductor device can be jointed to each other by the solder layer of In-based solder at a relatively low temperature. Thus, the discharge of oxygen from the inside of the superconductor film of a superconductor filter can be suppressed, and the decrease of the critical temperature $T_C$ can be suppressed.

3 Claims, 11 Drawing Sheets

SUPERCONDUCTOR DEVICE

CROSS-REFERENCE TO RELATED APPLICATION

This application is based upon and claims priority of Japanese Patent Application No. 2006-248201, filed on Sep. 13, 2006, the contents being incorporated herein by reference.

BACKGROUND OF THE INVENTION

The present invention relates to a coaxial connector and a method for manufacturing the coaxial connector, and a superconductor device and a method for manufacturing the superconductor device.

Superconductor filters using superconductor are recently much noted because of the good frequency characteristics in comparison with the general filters using electric good conductor.

The superconductor filter is used, loaded in a metal package which can shield the radio frequency from electromagnet and cooled down to about 70 K with, e.g., a freezer.

Figure 11:
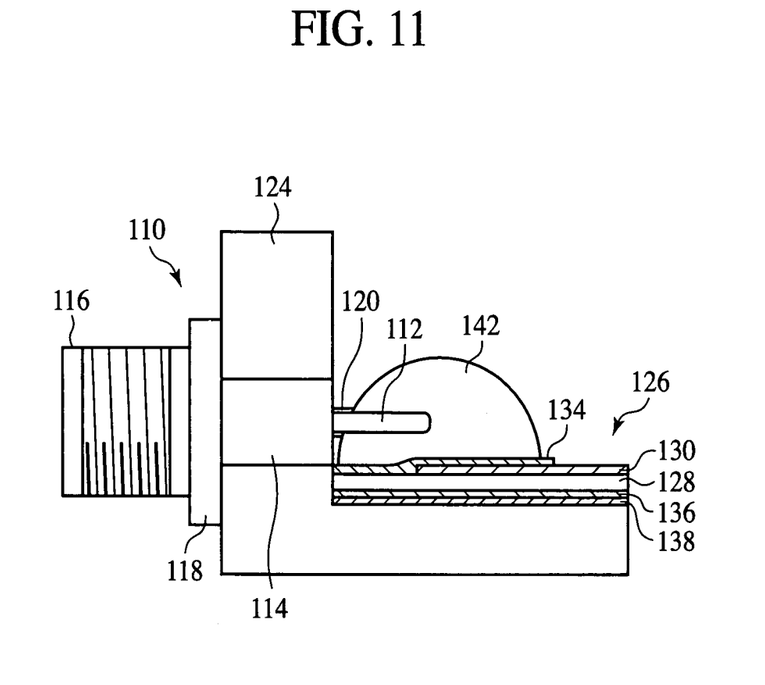
FIG. 11 is a sectional view of the proposed superconductor device.

The proposed superconductor device with a superconductor filter mounted on will be explained with reference to FIG. 11. FIG. 11 is a sectional view of the proposed superconductor device.

As illustrated in FIG. 11, the superconductor filter 126 is mounted in a metal package 124. The superconductor filter 126 comprises a dielectric substrate 128, patterns 130 of a superconductor film formed on the dielectric substrate 128, and a ground plane 136 formed below the dielectric substrate 128. An electrode 134 is formed on the end of the pattern 130, and a ground electrode 138 is formed below the ground plane 136.

A coaxial connector 110 for electrically connecting a coaxial cable (not illustrated) and the superconductor filter 126 is disposed on the end of the metal package 124. The coaxial connector 110 functions as a receptacle. The coaxial connector 110 comprises a terminal 112 which is the core conductor, an insulator 114, a coupling 116 and a body 118.

A surface coating layer 120 of, e.g., In (indium) is formed on the surface of the terminal 112. The terminal 112 of the coaxial connector 110 is connected to the electrode 134 of the superconductor filter 126 with In-based solder 142.

The In-based solder 142 is used to connect the terminal 112 of the coaxial connector 110 and the electrode 134 of the superconductor filter 126 to each other because the In-based solder 142 can have good flexibility not only at the room temperature but also at low temperatures. When the terminal of the coaxial connector and the electrode of the superconductor filter are connected to each other with the usual Sn-37% Pb solder, with the temperature changed between the room temperature and low temperatures, large stresses are applied to the solder junction due to thermal expansion coefficient differences between the metal package 124 and the superconductor filter 126, and the solder junction is released. However, In-based solder, which has flexibility at the room temperature and low temperatures, can mitigate stresses applied to the solder junction due to the thermal expansion coefficient difference between the metal package 124 and the superconductor filter 126 even when the temperature is changed between the room temperature and low temperatures.

The proposed superconductor device permits the coaxial cable (not illustrated) and the superconductor filter 126 to be electrically connected to each other by using the coaxial connector 110, which facilitates the operation of connecting devices and instruments.

Following references disclose the background art of the present invention.

[Patent Reference 1]
Specification of Japanese Patent Application Unexamined Publication No. 2003-282197

However, to connect the terminal 112 of the coaxial connector 110 and the electrode 134 of the superconductor filter 126 to each other with the In-based solder 142, thermal processing must be made at a temperature higher than about 157° C., which is the melting point of In. The temperature of the thermal processing is set at, e.g., about 200° C. The thermal processing is made at a temperature sufficiently higher than the melting point of In so as to quickly and surely connect the terminal 112 and the electrode 134 to each other with the In-based solder 142. When the thermal processing is made at such relatively high temperature, there is a risk that oxygen might be discharged from the superconductor films 130, 136 of the superconductor filter 126. When oxygen is discharged from the superconductor films 130, 136, the critical temperature $T_C$ of the superconductor films 130, 136 of the superconductor filter 126 is lowered. When the critical temperature $T_C$ is lowered, the superconductor filter 126 must be cooled at a temperature lower than the lowered critical temperature $T_C$, and the freezer is much loaded.

SUMMARY OF THE INVENTION

According to one aspect of the present invention, there is provided a coaxial connector to be connected to a coaxial cable, including a surface covering layer formed of a metal material which causes an eutectic reaction with In on a surface of a terminal which is a core conductor.

According to another aspect of the present invention, there is provided a method for manufacturing a coaxial connector to be connected to a coaxial cable, including the step of forming a surface covering layer formed of metal material which causes the eutectic reaction with In on a surface of a terminal which is a core conductor.

According to further another aspect of the present invention, there is provided a superconductor device including: a coaxial connector coupled to a coaxial cable; and a superconductor filter connected to the coaxial cable via the coaxial connector, a surface covering layer of a metal material which causes the eutectic reaction with In being formed on a surface of a terminal of a core conductor of the coaxial connector, and an electrode of the superconductor filter and the terminal being jointed to each other by a solder layer of In-based solder.

According to further another aspect of the present invention, there is provided a method for manufacturing a superconductor device including a coaxial connector to be connected to a coaxial cable, and a superconductor filter connected to the coaxial cable via the coaxial connector, including: the first step of forming a surface covering layer of a metal material which causes the eutectic reaction with In on a surface of a terminal which is a core conductor of the coaxial connector; the second step of forming a solder layer of In-based solder on an electrode of the superconductor filter; and the third step of making thermal processing to joint the terminal and the electrode to each other by the In-based solder.

DETAILED DESCRIPTION OF THE INVENTION

[One Embodiment]

The coaxial connector and the method for manufacturing the coaxial connector, and the superconductor device and the method for manufacturing the superconductor device according to one embodiment of the present invention will be explained with reference to FIGS. 1 to 7.

Figure 1:
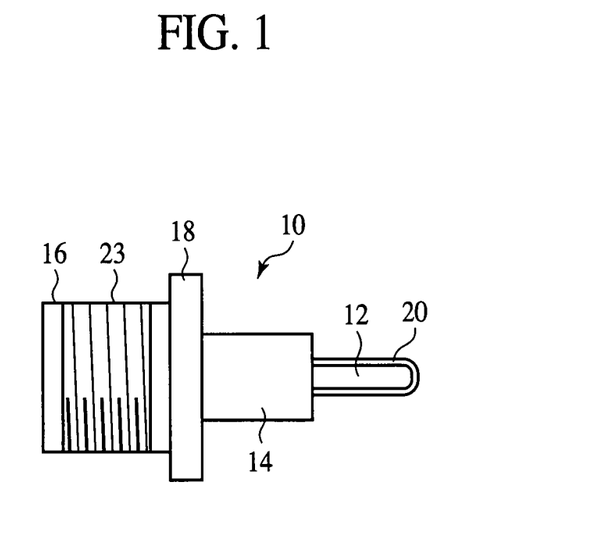
FIG. 1 is a side view of the coaxial connector according to one embodiment of the present invention.

First, the coaxial connector according to the present embodiment will be explained with reference to FIG. 1. FIG. 1 is the side view of the coaxial connector according to the present embodiment. The end of the terminal is shown in section.

As illustrated in FIG. 1, the coaxial connector 10 comprises a terminal 12 which is the core conductor, a cylindrical insulator 14 of fluoroplastics formed around the terminal 12, a cylindrical coupling 16 which is an outer conductor formed around the insulator 14, the terminal 12, and a body 18 supporting the terminal 12, the insulator 14 and the coupling 16.

As will be described later, the coaxial connector 10 according to the present embodiment is jointed by a solder layer 42 of In-based solder (see FIGS. 3A and 3B).

The coaxial connector 10 is the coaxial connector of SMA (SUB-MINIATURE TYPE A) and functions as a receptacle.

The end of the terminal 12, which is on the right side of the drawing is rod-shaped. The terminal 12 is formed of, e.g. Cu.

A surface covering layer 20 of a metal material which causes the eutectic reaction with In is formed on the surface of the terminal 12. The thickness of the surface covering layer 20 is, e.g., 100 μm. The surface covering layer 20 is formed of, e.g. Sn (tin).

Figure 2:
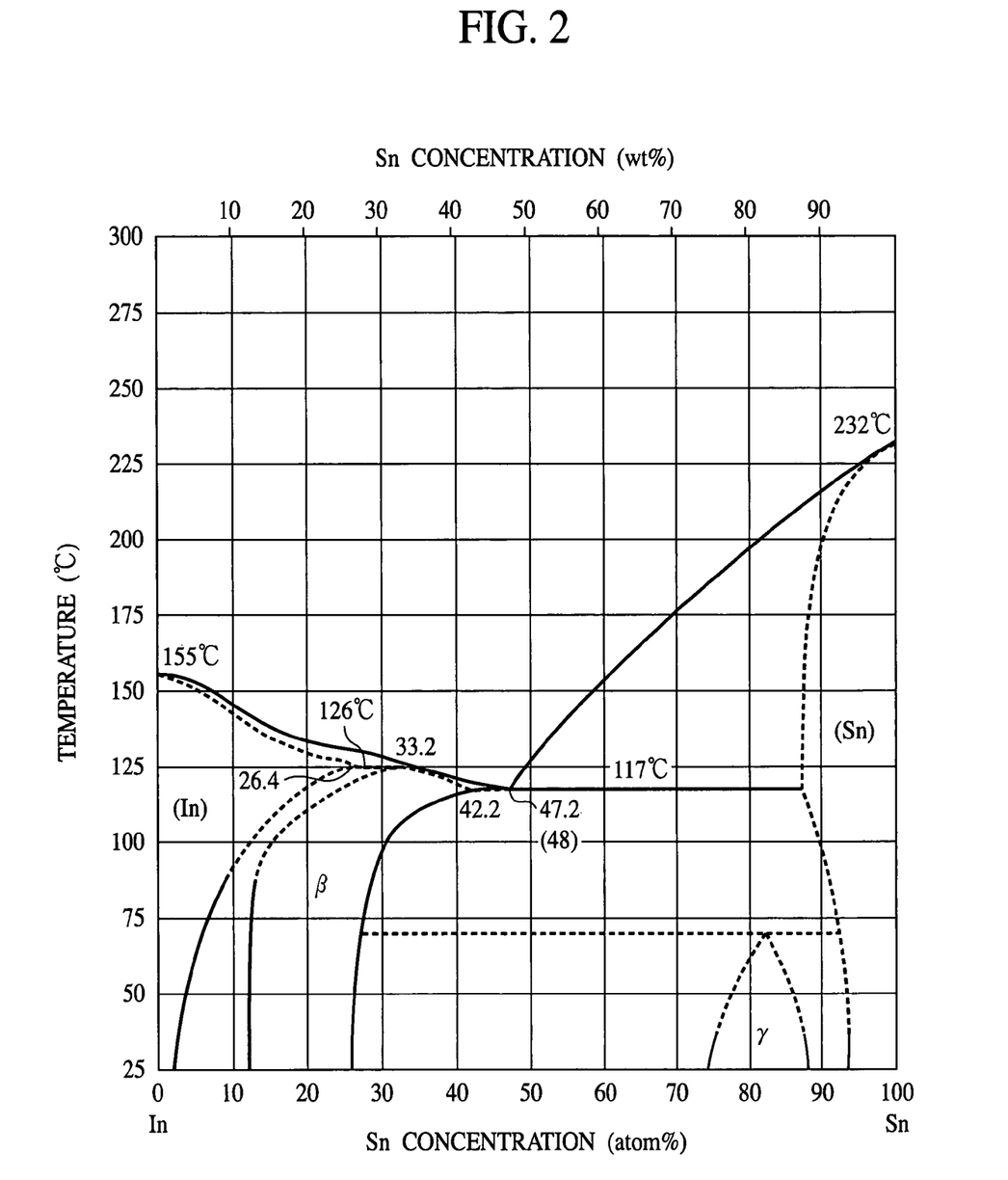
FIG. 2 is the phase diagram of In—Sn alloy.

FIG. 2 is a view of the phase diagram of In—Sn alloy. In FIG. 2, concentrations (weight %) of Sn are taken on the horizontal axis at the bottom as viewed in FIG. 2, and on the upper horizontal axis, concentrations (weight %) of Sn are taken. On the vertical axis, temperatures are taken. The phase diagram of FIG. 2 is described in M. Hansen, "Constitution of Binary Alloys", McGraw-Hill, (1958).

As evident in FIG. 2, the melting point of In is about 155° C. The melting point of Sn is about 232° C. The eutectic temperature (eutectic point) of In—Sn alloy is about 117° C. Based on them, the eutectic reaction of In and Sn is caused at a temperature lower than 155° C., which is lower than the melting point of In.

Figure 3A:
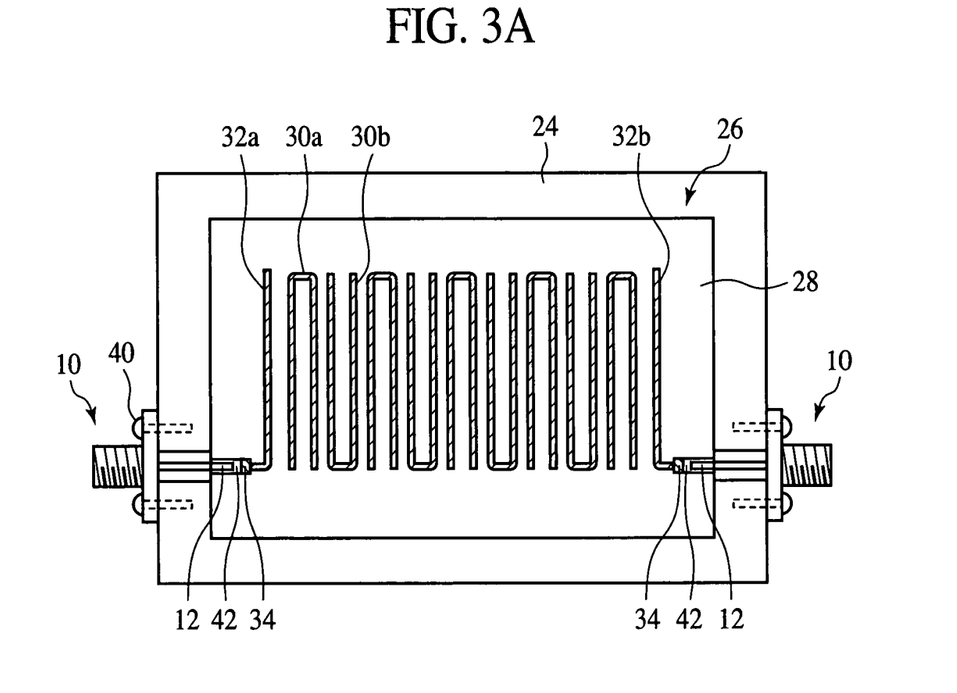
FIGS. 3A and 3B are diagrammatic views illustrating the superconductor device according to the embodiment of the present invention.
Figure 3B:
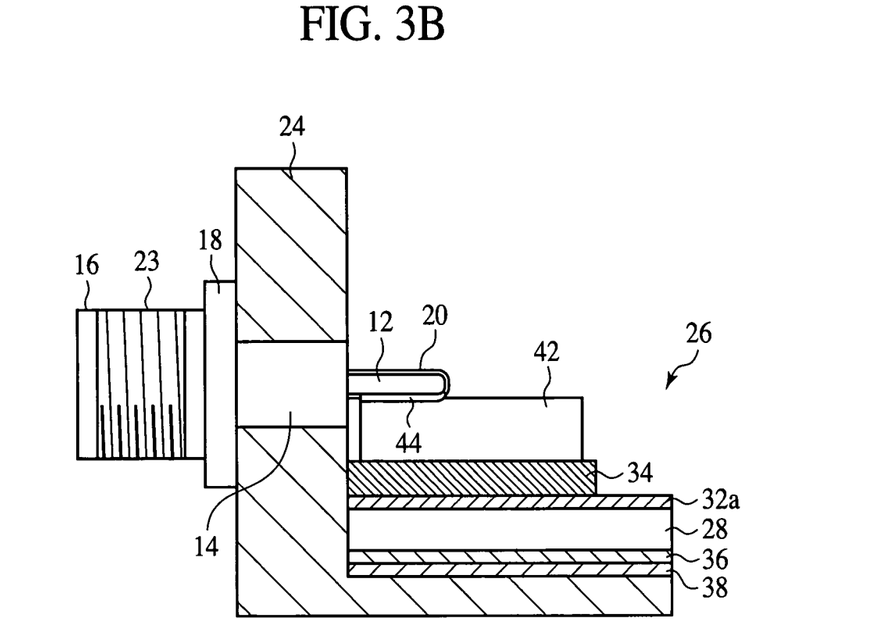

In the present embodiment, because of the surface covering layer 20 of Sn formed on the surface of the terminal 12, when the terminal 12 of the coaxial connector 10 and the electrode 34 of the superconductor film 26 are connected to each other by the solder layer 42 of In-based solder (see FIG. 3B), the eutectic reaction of In and Sn takes places to form an eutectic alloy layer 44 of In and Sn (see FIG. 3B). As described above, because the eutectic temperature of In—Sn alloy is lower than the melting point of In, according to the present embodiment, the terminal 12 of the coaxial connector 10 and the electrode 34 of the superconductor filter 26 can be jointed at a relatively low temperature. Thus, according to the present embodiment, the discharge of oxygen from the superconductor films 30a, 30b, 32a, 32b, 36 of the superconductor filter 26 (see FIGS. 3A and 3B) can be suppressed, and the decrease of the critical temperature $T_C$ can be suppressed.

The critical temperature means a temperature at which a substance becomes superconductive, i.e., a temperature at which the electric resistance of a superconductor becomes zero.

In the present specification, In-based solder means pure In, a binary alloy containing In, a ternary or more alloy containing In as the main component, etc.

The periphery of the coupling 16 has a thread 23. The coupling 16 functions as a male coupling in coupling the coaxial connector with a coaxial connector (not illustrated) of a coaxial cable (not illustrated) by screwed coupling.

Thus, the coaxial connector according to the present embodiment is constituted.

(The Method for Manufacturing the Coaxial Connector)

Next, the method for manufacturing the coaxial connector will be explained with reference to FIG. 1.

First, the terminal 12 of, e.g., Cu is prepared.

Next, the surface covering layer 20 is formed on the surface of the terminal 12 by, e.g., dip. Specifically, the surface covering layer 20 is formed on the surface of the terminal 12 as follows.

First, a rosin-based flux, for example, is applied to the surface of the terminal 12.

Next, the terminal 12 is immersed in a molten Sn-based solder bath. Then, the surface covering layer 20 of Sn is formed on the surface of the terminal 12.

Thus, the terminal 12 having the surface covering layer 20 of Sn formed on the surface is formed.

The surface covering layer 20 is formed on the surface of the terminal 12 by dipping here but may not be formed essentially by dipping. For example, the surface covering layer 20 can be formed on the surface of the terminal 12, e.g., by plating or vapor deposition.

The thus formed terminal 12 is assembled with the insulator 14, the coupling 16, the body 18, etc., and the coaxial connector 10 according to the present embodiment is manufactured.

The surface covering layer 20 can be formed also by masking the rest of the terminal 12 after the respective constituent parts have been assembled, and forming the surface covering layer 20 on the surface of the terminal 12.

(The Superconductor Device)

Then, the superconductor device using the coaxial connector according to the present embodiment will be explained with reference to FIGS. 3A and 3B. FIGS. 3A and 3B are diagrammatic views of the superconductor device according to the present embodiment. FIG. 3A is a plan view, and FIG. 3B is a sectional view.

As illustrated in FIG. 3A, the superconductor device according to the present embodiment comprises a metal package 24, a superconductor filter 26 mounted in the metal package 24, and the coaxial connectors 10 electrically interconnecting the superconductor filter 26 and coaxial cables (not illustrated).

The metal package 24 can be formed, e.g., of copper, copper alloy, aluminum, aluminum alloy, Kovar, Invar, 42 alloy or others. The metal package 24 is formed of oxygen free copper here. The external dimensions of the metal package 24 are, e.g., 54 mm×48 mm×13.5 mm.

In the metal package 24, the superconductor filter 26 which is, e.g., a 2 GHz-band filter is mounted.

Then, the superconductor filter 26 will be explained.

The substrate of the superconductor filter 26 is a dielectric substrate 28 of MgO single crystal. The dimensions of the dielectric substrate 28 is, e.g., 38 mm×44 mm×0.5 mm.

On the dielectric substrate 28, ½-wavelength hair pin patterns 30a, 30b of superconductor film are alternately formed. The superconductor film forming the hair pin patterns 30a, 30b is superconductor film of, e.g., $YBa_2Cu_3O_X$ (X=6.5 to 7) as the main component (hereinafter called "YBCO-based superconductor film"). Such superconductor film is high-temperature superconductor film, whose critical temperature is relatively high. The hair pin patterns 30a and the hair pin patterns 30b are arrange generally in one row. Totally 9 hair pin patterns 30a, 30b are arranged. On the dielectric substrate 28 on both sides of the one row of the hair pin patterns 30a, 30b, ¼ wavelength feeder line patterns 32a, 32b of superconductor film are formed. The superconductor film forming the ¼-wavelength feeder line patterns 32a, 32b is, e.g., the YBCO-based superconductor film.

The electrodes 34 respectively of Au/Pd/Cr structure are formed on the ends of the feeder line patterns 32a, 32b.

On the underside of the dielectric substrate 28, a ground plane 36 of superconductor film is formed. The superconductor film forming the ground plane 36 is, e.g., the YBCO-based superconductor film. The ground plane 36 is formed solid.

Below the ground plane 36, a ground electrode 38 of, e.g., Ag film is formed. The ground electrode 38 is formed solid.

Thus, the superconductor filter 26 is constituted. Such superconductor filter 26 functions as a micro-strip line type band-pass filter of, e.g., 2 GHz band.

The ground electrode 38 of the superconductor filter 26 is electrically connected to the metal package 24.

The coaxial connectors 10 are mounted on both ends of the metal package 24. The coaxial connectors 10 are secured to the metal package 24 with vises 40.

To the coaxial connector 10 on the left side of the drawing of FIG. 3A, the coaxial connector (not illustrated) of the coaxial cable (not illustrated) on the input side is connected. On the other hand, to the coaxial connector 10 on the right side of the drawing of FIG. 3A, the coaxial connector (not illustrated) of the coaxial cable (not illustrated) on the output side is connected. As described above, the coaxial connectors (not illustrated) of the coaxial cables (not illustrated) and the coaxial connectors 10 are coupled by screwed coupling.

The terminals 12 of the coaxial connectors 10 and the electrodes 34 of the superconductor filter 28 are respectively connected to each other by the solder layer 42 of In-based solder.

The eutectic alloy layer 44 of Sn and In is selectively formed in the joints between the terminals 12 and the solder layer 42. The eutectic alloy layer 44 of Sn and In is not always good in flexibility, and when all the solder layer 42 is formed of the eutectic alloy layer, there is a risk that the repetition of the temperature cycle of the room temperature and a low temperature might break the joints between the terminals 12 and the electrodes 34. In the present embodiment, the eutectic alloy layer 44 of Sn and In is formed selectively in the joints between the terminals 12 and the solder layer 42, and most of the solder layer 42 is not the eutectic alloy. The part of the solder layer 42, which is not the eutectic alloy has good flexibility. Thus, according to the present embodiment, the superconductor device which can endure the repetition of the temperature change between the room temperature and a low temperature can be provided.

Thus, the superconductor device according to the present embodiment is constituted.

The superconductor device according to the present embodiment is characterized mainly in that the surface covering layer 20 of a metal material which causes the eutectic reaction with In is formed on the surfaces of the terminals 12 of the coaxial connectors 10.

As described above, in connecting the terminals of the coaxial connectors and the electrodes of the superconductor filter simply by the In-based solder, thermal processing must be made at a relatively high temperature, which might cause a risk that oxygen is discharged from the inside of the superconductor film of the superconductor filter, and the critical temperature $T_C$ might be lowered.

In the present embodiment, however, the surface covering layer 20 of a metal material which causes the eutectic reaction with In is formed on the surfaces of the terminals 12 of the coaxial connectors 10, which permits the terminals 12 of the coaxial connectors 10 and the electrodes 34 of the superconductor filter 26 to be connected by the solder layer 42 of In-based solder at a relatively low temperature. Thus, according to the present embodiment, the discharge of oxygen from the insides of the superconductor films 30a, 30b, 32a, 32b can be suppressed, and the decrease of the critical temperature $T_C$ can be suppressed.

(The Method for Manufacturing the Superconductor Device)

Next, the method for manufacturing the superconductor device according to the present embodiment will be explained with reference to FIGS. 4A to 7. FIGS. 4A to 7 are views illustrating the steps of the method for manufacturing the superconductor device according to the present embodiment.

Figure 4A:
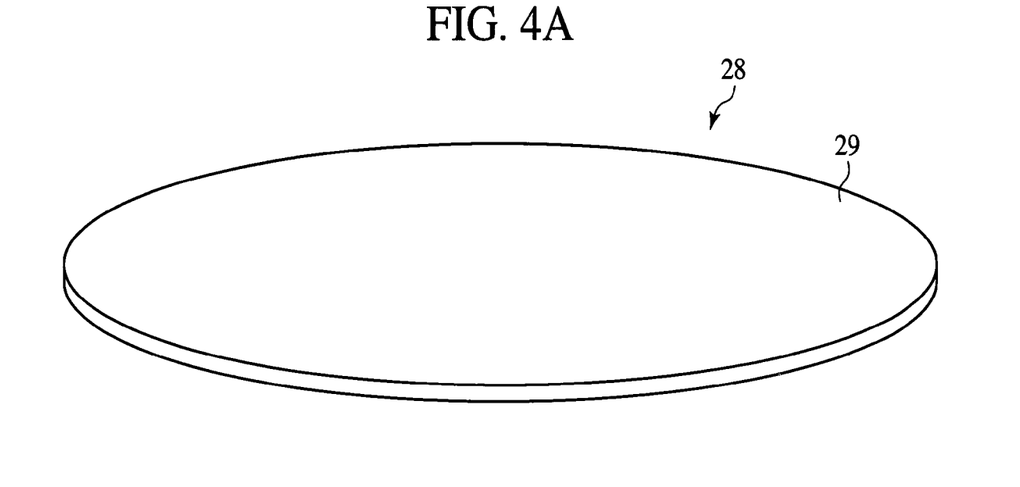
FIGS. 4A to 4C are views illustrating the steps of the method for manufacturing the superconductor device according to the embodiment of the present invention (Part 1).
Figure 4B:
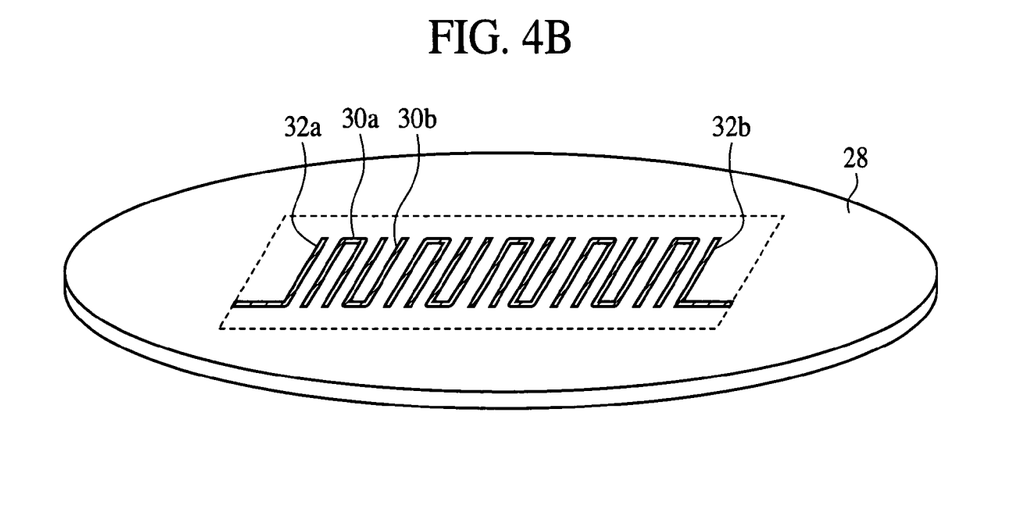

First, as illustrated in FIG. 4A, the dielectric substrate 28 of, e.g., MgO single crystal is prepared. The dimensions of the dielectric substrate 28 is, e.g., φ2 inches and a 0.5 mm-thickness.

Next, the superconductor film 29 is formed on one surface (the first surface) of the dielectric substrate 28 by, e.g., laser vapor deposition. The superconductor film 29 is, e.g., YBCO-based superconductor film.

Next, the superconductor film 36 (see FIG. 3B) is formed on the other surface (the second surface) of the dielectric substrate 28 by, e.g., laser deposition. The superconductor film 36 is, e.g., YBCO-based superconductor film.

Next, the superconductor film 29 formed on one surface of the dielectric substrate 28 is patterned by photolithography. Thus, the hair pin patterns 30a, 30b and the feeder line patterns 32a, 32b of the superconductor film 29 are formed (see FIG. 4B).

Next, the dielectric substrate 28 is cut in the prescribed dimensions by a dicing saw. Thus, the dimensions of the dielectric film 28 are, e.g., 38 mm×44 mm×0.5 mm (see FIG. 4C).

Figure 4C:
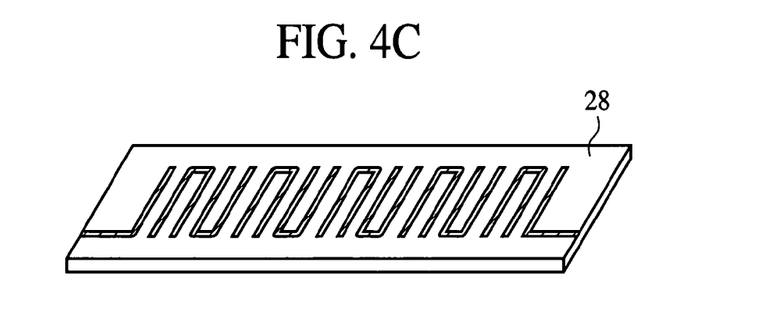

Then, a mask having openings (not illustrated) for forming the electrodes 34 formed in is placed on one surface of the dielectric substrate 28. At this time, the dielectric substrate 28 and the mask are positioned with the parts of the dielectric substrate 28 where the electrodes 34 are to be formed and the openings being in register with each other.

Then, a Cr film, a Pd film and an Au film are sequentially formed by vacuum vapor deposition. Thus, the electrodes 34 of the Au/Pd/Cr structure is formed (see FIG. 5A).

Then, an Ag film is formed entirely on the other surface of the dielectric substrate 28 by vacuum vapor deposition. Thus, the ground electrode 38 of, e.g. Ag film is formed solid (see FIG. 3B).

Figure 5A:
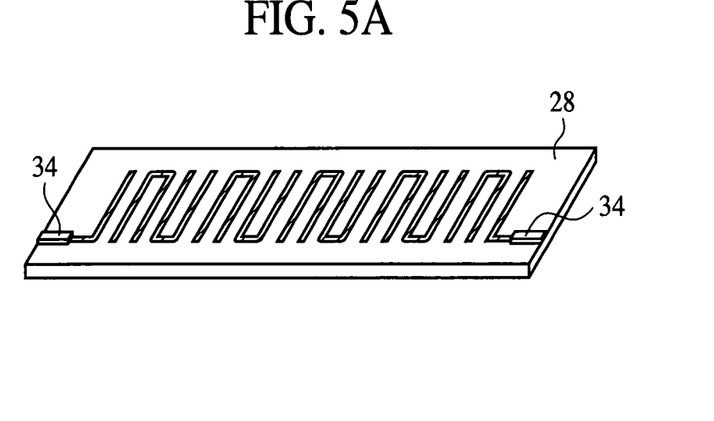
FIGS. 5A and 5B are views illustrating the steps of the method for manufacturing the superconductor device according to the embodiment of the present invention (Part 2).
Figure 5B:
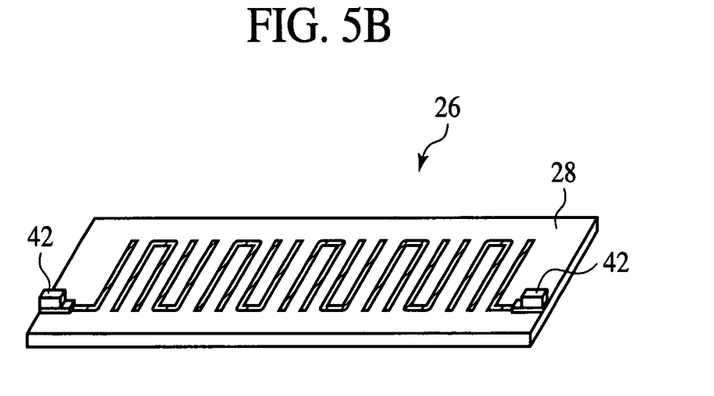

Next, the solder layer 42 of In-based solder is formed on the electrodes 34 by, e.g., vapor deposition. The thickness of the solder layer 42 is, e.g., about 500 μm.

The solder layer 42 is formed by vapor deposition here but may not be formed essentially by vapor deposition. For example, the solder layer 42 may be formed by plating or others.

Thus, the superconductor filter 26 is formed. Such superconductor filter 26 functions as a micro-strip line type band-pass filter of, e.g., 2 GHz (see FIG. 5B).

Figure 6A:
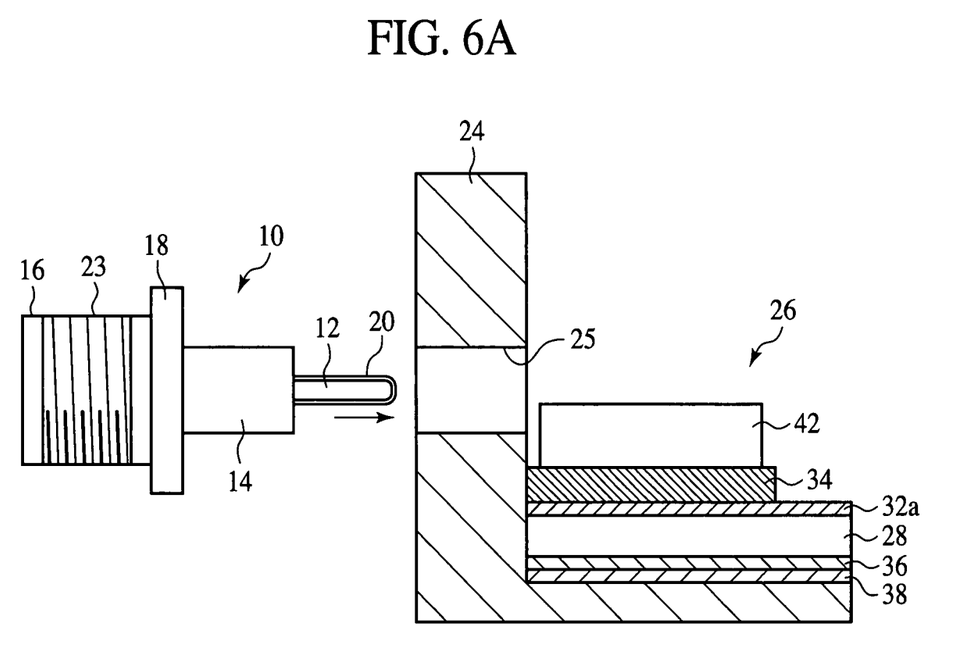
FIGS. 6A and 6B are views illustrating the steps of the method for manufacturing the superconductor device according to the embodiment of the present invention (Part 3).

Next, the superconductor filter 26 is mounted into the metal package 24 (see FIG. 6A). The metal package 24 is formed of, e.g., copper, copper alloy, aluminum, aluminum alloy, Kovar, Invar, 42 alloy or others. The metal package 24 is formed of, e.g., oxygen free copper here. The superconductor filter 26 is secured to the inside of the metal package 24 with, e.g., leaf springs (not illustrated).

Next, the coaxial connectors 10 according to the present embodiment described above are mounted on the metal package 24. Specifically, the insulators 14 of the coaxial connectors 10 are fit into the openings 25 of the metal package 24, and the bodies 18 of the coaxial connectors 10 is fixed to the metal package 24 with the vises 40 (see FIG. 3A). Thus, the terminals 12 of the coaxial connectors 10 and the solder layer 42 are brought into contact with each other (see FIG. 6B).

Figure 6B:
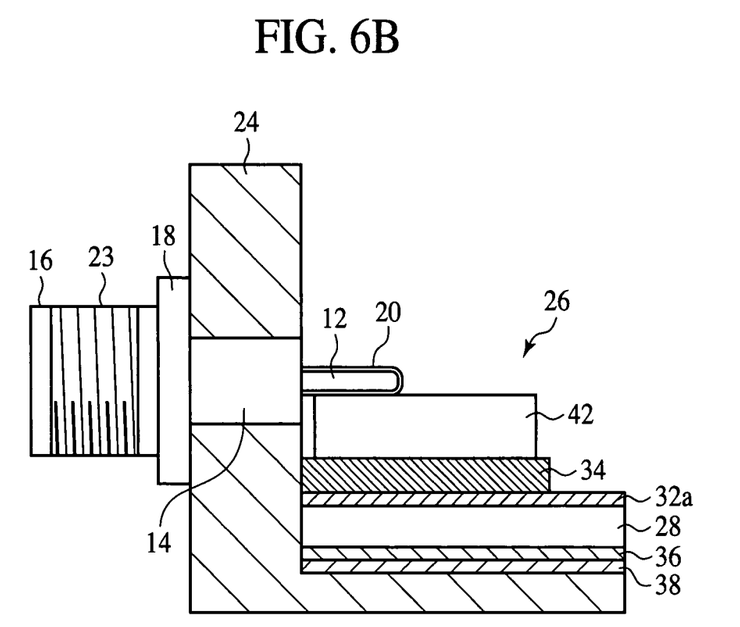

Then, thermal processing is made to cause the eutectic reaction of the Sn of the surface covering layer 20 and the In of the solder layer 42. The thermal processing temperature is a temperature higher than the eutectic temperature (eutectic point) of Sn and In. The eutectic temperature of Sn and In is about 117° C. Accordingly, by setting the thermal processing temperature at 117° C. or above, the eutectic reaction can be caused. However, in the thermal processing, it is preferable to set the thermal processing temperature somewhat higher than the eutectic temperature. This is because the junction interface can surely have the eutectic temperature in consideration of disuniform heating among the constituent members of the superconductor filter 26. When the thermal processing temperature is not set much higher than the eutectic temperature, it takes a long time for the contact (junction interface) between the surface covering layer 20 and the solder layer 42 to reach the eutectic temperature, and the superconductor films 30a, 30b, 32a, 32b, 36 of the superconductor filter 26 are heated for a long period of time. Then, there is a risk that some oxygen might be discharged from the insides of the superconductor films 30a, 30b, 32a, 32b, 36. When the thermal processing temperature is not much higher than the eutectic temperature, the eutectic reaction of the Sn of the surface covering layer 20 and the In of the solder layer 42 is not sufficiently caused, and there is a risk that the surface covering layer 20 and the solder layer 42 could not be surely jointed. In the thermal processing, it is preferable set the thermal processing temperature somewhat higher than the eutectic temperature. On the other hand, when the thermal processing temperature is set too high, there is a risk that a large amount of oxygen might be discharged from the superconductor films 30a, 30b, 32a, 32b, 36. In view of the above, it is preferable to set the thermal processing temperature at about 117° C. to 137° C. The thermal processing temperature is set at about 130° C. here.

The thermal processing apparatus (not illustrated) used in the thermal processing is, e.g., a hot plate, an infrared heating furnace, a resistance heating furnace, a vapor phase soldering apparatus, a laser soldering apparatus, a soldering iron, or others. The thermal processing apparatus is, e.g. a hot plate here.

The thermal processing changes the contact between the terminals 12 and the solder layer 42 from the solid phase to the liquid phase, and the eutectic alloy layer 44 of Sn and In is formed in the interfaces between the terminals 12 and the solder layer 42. Then, when the thermal processing is finished, the eutectic alloy layer 44 of the terminals 12 and the solder layer 42 changes from the liquid phase to the solid phase. Thus, the eutectic alloy layer 44 of Sn and In is formed in the junctions between the terminals 12 and the solder layer 42, and the terminals 12 of the coaxial connectors 10 and the electrodes 34 of the superconductor filter 26 are jointed by the solder layer 42.

In the thermal processing, a flux may be used. The use of the flux facilitates the removal of surface oxide film (not illustrated) of the surface covering layer 20 and surface oxide film (not illustrated) of the solder layer 42, and the contacts between the terminals 12 and the solder layer 42 can be easily changed to the liquid phase.

Figure 7:
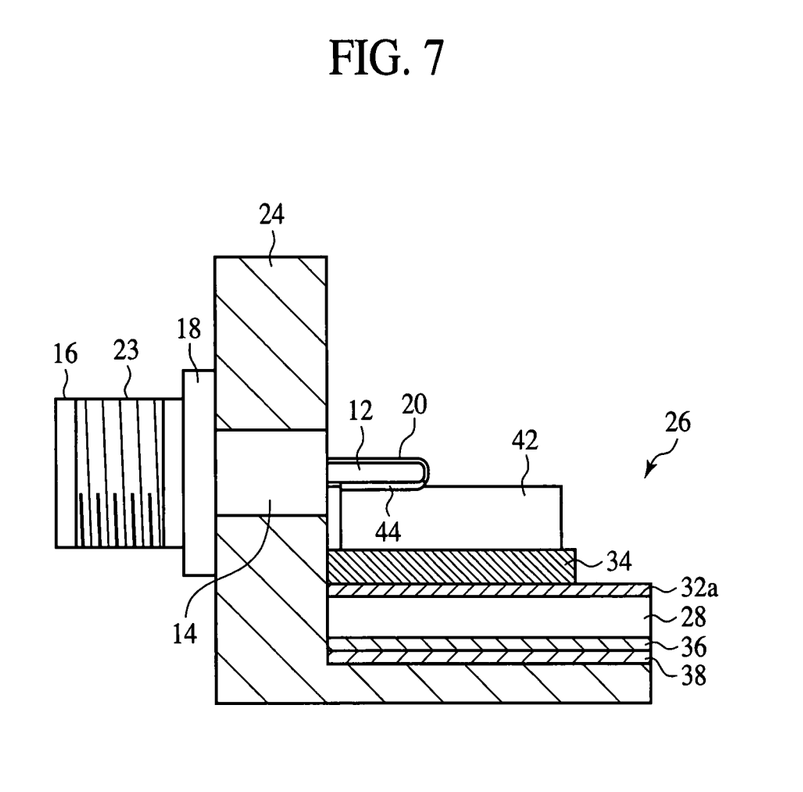
FIG. 7 is a view illustrating the step of the method for manufacturing the superconductor device according to the embodiment of the present invention (Part 4).

Thus, the superconductor device according to the present embodiment is manufactured (see FIG. 7).

According to the present embodiment, the surface covering layer 20 of a metal material which causes the eutectic reaction with In is formed on the surface of the coaxial connector 12, whereby the terminals 12 of the coaxial connectors 10 and the electrodes 34 of the superconductor filter 26 can be jointed to each other by the solder layer 42 of In-based solder at a relatively low thermal processing temperature. Thus, according to the present embodiment, the discharge of oxygen from the insides of the superconductor films 30a, 30b, 32a, 32b, 36 of the superconductor filter 26 can be suppressed, and the decrease of the critical temperature $T_C$ can be suppressed.

[Modified Embodiments]

The present invention is not limited to the above-described embodiment and can cover other various modifications.

For example, in the above-described embodiment, the surface covering layer 20 is formed of Sn but may not be formed essentially of Sn. A metal material which causes the eutectic reaction with In can be used as the material of the surface covering layer 20. For example, Bi (bismuth), Ga (gallium), Zn (zinc) or others may be used as the material of the surface covering layer 20.

Figure 8:
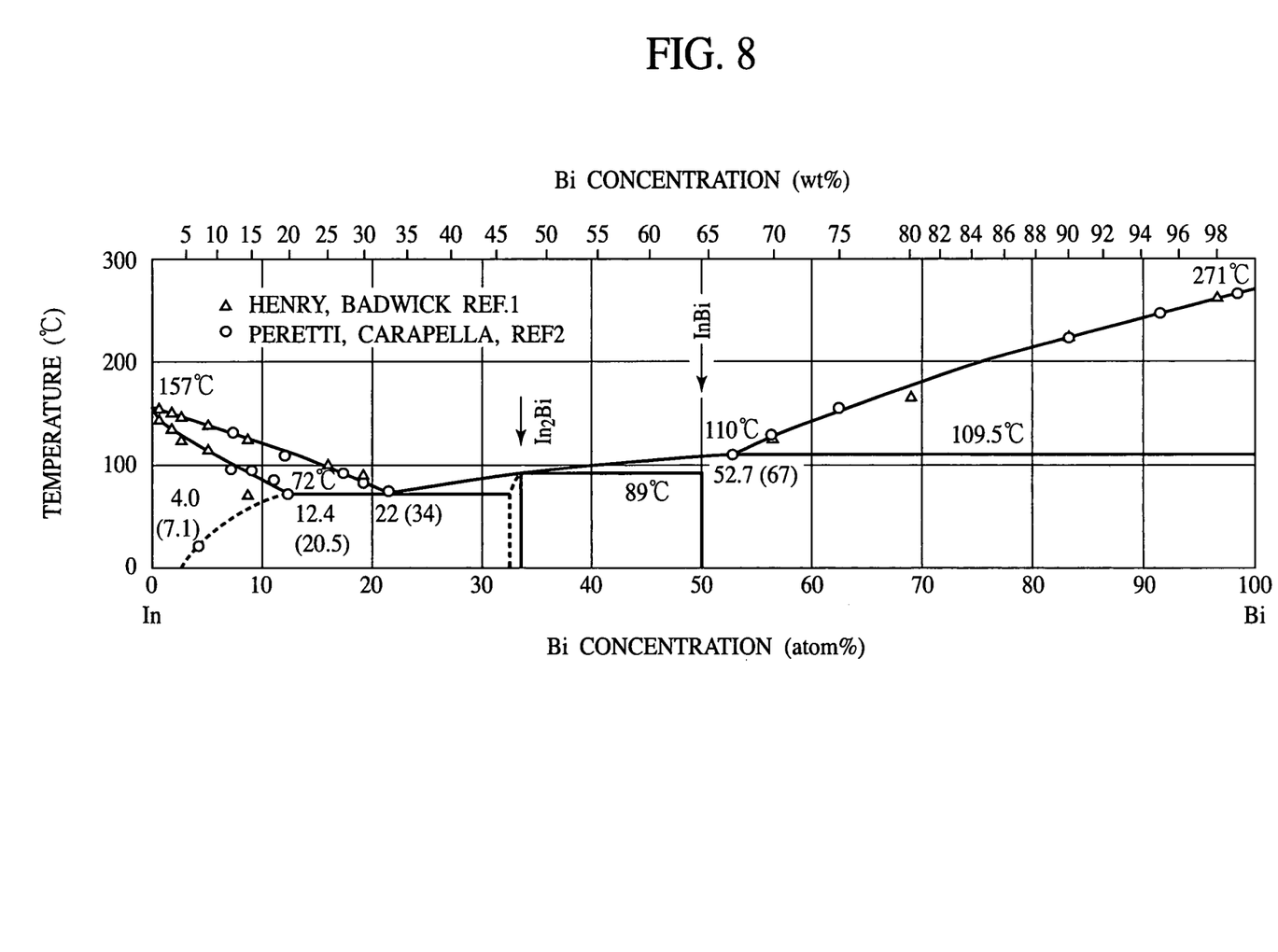
FIG. 8 is the phase diagram of In—Bi alloy.

FIG. 8 is the phase diagram of In—Bi alloy. In FIG. 8, the concentration (atomic %) of Bi is taken on the lower horizontal axis. On the upper horizontal axis, the concentration (weight %) of Bi is taken, and the temperature is taken on the vertical axis. The phase diagram of FIG. 8 is described in M. Hansen, "Constitution of Binary Alloys", McGraw-Hill, (1958).

As evident in FIG. 8, the melting point of In is about 157° C. The melting point of Bi is about 271° C. The eutectic temperature (eutectic point) of In—Bi alloy is about 72° C. That is, the eutectic reaction of In and Bi takes place at a temperature lower than the melting point of In. Accordingly, even when the surface covering layer 20 is formed of Bi, the terminals 12 of the coaxial connectors 10 and the electrodes 34 of the superconductor filter 26 can be jointed to each other at a relatively low temperature. When the surface covering layer 20 is formed of Bi, the thermal processing temperature is, e.g., about 72 to 92° C.

Figure 9:
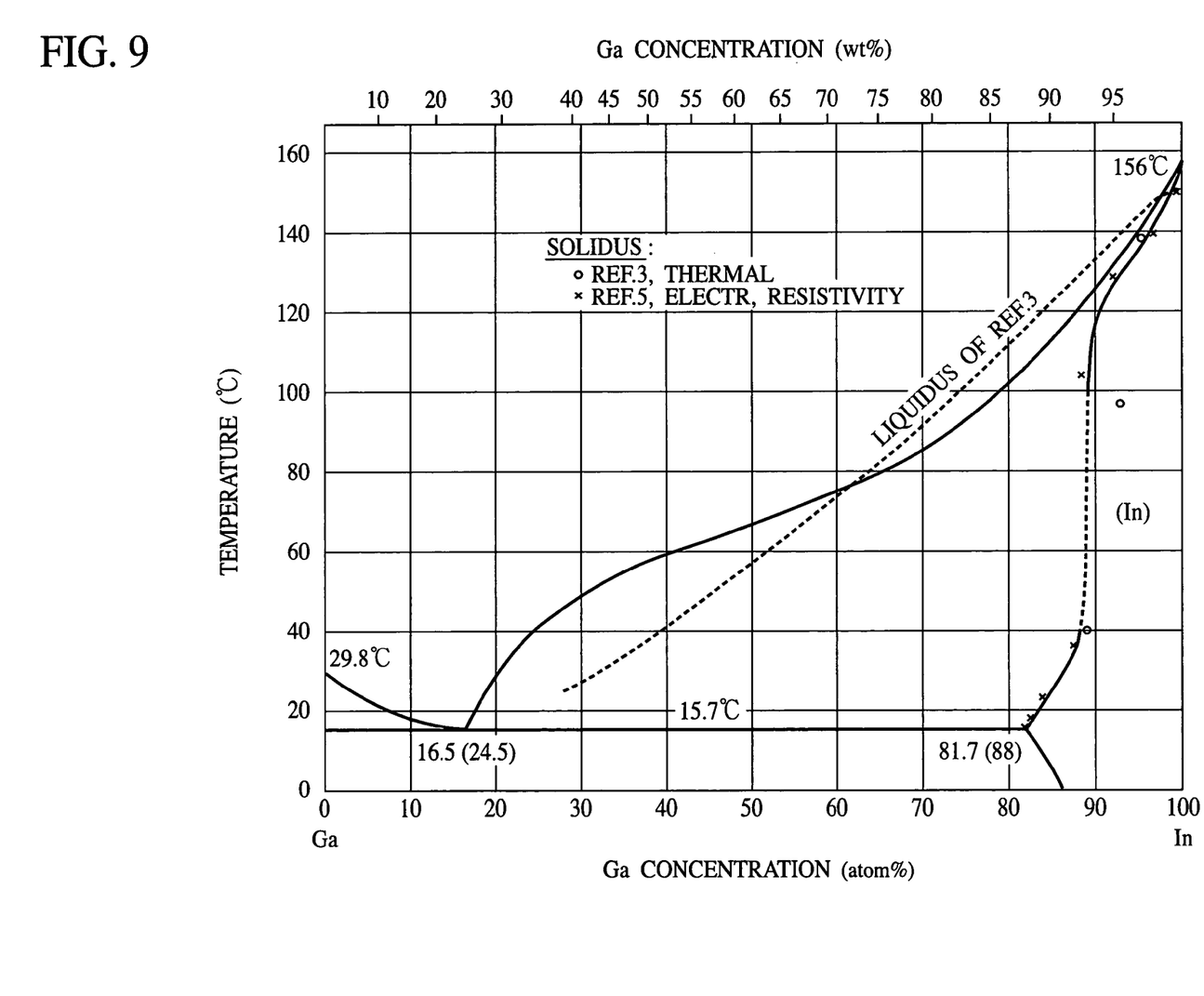
FIG. 9 is the phase diagram of In—Ga alloy.

FIG. 9 is the phase diagram of In—Ga alloy. In FIG. 9, the concentration (atomic %) of Ga is taken on the lower horizontal axis, the concentration (weight %) of Ga is taken on the upper horizontal axis, and on the vertical axis, the temperature is taken. The phase diagram of FIG. 9 is described in M. Hansen, "Constitution of Binary Alloys", McGraw-Hill, (1958).

As evident in FIG. 9, the melting point of In is about 156° C. The melting point of Ga is about 29.8° C. The eutectic temperature (eutectic point) of In—Ga is about 15.7° C. That is, the eutectic reaction of In and Ga takes place at a temperature lower than the melting point of In. Accordingly, even when the surface covering layer 20 is formed of Ga, the terminals 12 of the coaxial connectors 10 and the electrodes 34 of the superconductor filter 26 can be jointed to each other at a relatively low temperature. When the surface covering layer 20 is formed of Ga, the thermal processing temperature is set at, e.g., about 15.7 to 35.7° C.

Figure 10:
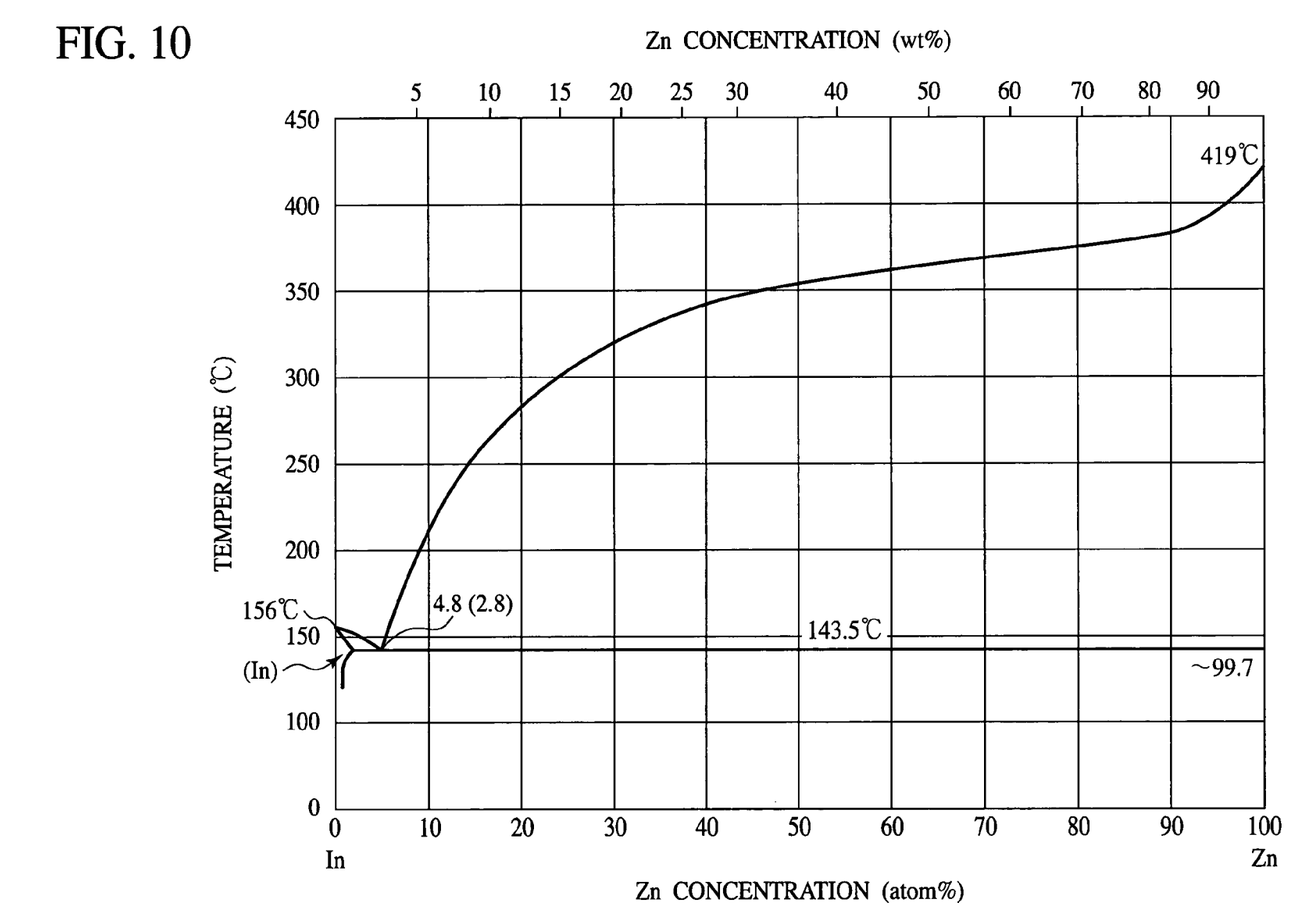
FIG. 10 is the phase diagram of In—Zn alloy.

FIG. 10 is the phase diagram of In—Zn alloy. In FIG. 10, the concentration (atomic %) of Zn is taken on the lower horizontal axis, the concentration (weight %) of Zn is taken on the upper horizontal axis, and on the vertical axis, the temperature is taken. The phase diagram of FIG. 10 is described in M. Hansen, "Constitution of Binary Alloys", McGraw-Hill, (1958).

As evident in FIG. 10, the melting point of In is about 156° C. The melting point of Zn is about 419° C. The eutectic temperature (eutectic point) of In—Zn alloy is about 143.5° C. That is, the eutectic reaction of In and Zn takes place at a temperature lower than the melting point of In. Accordingly, even when the surface covering layer 20 is formed of Zn, the terminals 12 of the coaxial connectors 10 and the electrodes 34 of the superconductor filter 26 can be jointed to each other at a relatively low temperature. When the surface covering layer 20 is formed of Zn, the thermal processing temperature can be set at, e.g., about 143.5 to 155° C.

In the above-described embodiment, the superconductor films 30a, 30b, 32a, 32b, 36 used in the superconductor filter 26 are YBCO-based superconductor film but is not essentially YBCO-based superconductor film. For example, the superconductor films 30a, 30b, 32a, 32b, 36 may be formed suitably of R—Ba—Cu—O-based superconductor material in which R is any one of Y (yttrium), Nd (neodymium), Yb (ytterbium), Sm (samarium) and Ho (holmium). The superconductor films 30a, 30b, 32a, 32b, 36 may be formed of Bi—Sr—Ca—Cu—O-based superconductor material, Pb—Bi—Sr—Ca—Cu—O-based superconductor material or others. The superconductor films 30a, 30b, 32a, 32b, 36 may be formed of $CuBa_pCa_qCu_rO_X$ ($1.5<p<2.5$, $2.5<q<3.5$, $3.5<r<4.5$).

In the above-described embodiment, the superconductor element connected to the coaxial connector 10 is the superconductor filter 126 but is not limited to the superconductor filter 126. The principle of the present invention is applicable to connecting the coaxial connector 10 to any superconductor element.

What is claimed is:

1. A superconductor device comprising:
    a coaxial connector coupled to a coaxial cable; and
    a superconductor filter connected to the coaxial cable via the coaxial connector,
    a surface covering layer of a metal material which causes the eutectic reaction with In being formed on a surface of a terminal of a core conductor of the coaxial connector, and
    an electrode of the superconductor filter and the terminal being jointed to each other by a solder layer of In-based solder,
    wherein the metal material is Bi, Ga or Zn,
    an eutectic alloy layer of In and the metal material is formed selectively in a contact between the solder layer and the terminal, and
    the surface covering layer of the metal material of which the eutectic reaction has not been caused is present on the surface of the terminal in a part except the contact between the solder layer and the terminal.

2. The superconductor device according to claim 1, wherein
    a part where the eutectic reaction of In and the metal material has not been caused is present in the solder layer.

3. The superconductor device according to claim 1, wherein
    the superconductor filter includes a pattern of a superconductor film formed on a substrate, and
    the superconductor film is formed of R—Ba—Cu—O-based superconductor material in which R is one of Y, Nd, Yb, Sm and Ho, Bi—Sr—Ca—Cu—O-based superconductor material, Pb—Bi—Sr—Ca—Cu—O-based superconductor material or $CuBa_pCa_qCu_rO_x$ wherein p, q, and r are real number with $1.5<p<2.5$, $2.5<q<3.5$, $3.5<r<4.5$.

* * * * *